United States Patent [19]

Moore et al.

[11] 4,296,369

[45] Oct. 20, 1981

[54] ACTIVE QUADRATURE CURRENT REFERENCE SOURCE

[75] Inventors: William J. M. Moore; Norbert L. Kusters; Eddy So, all of Ottawa, Canada

[73] Assignee: Canadian Patents & Dev. Ltd., Ottawa, Canada

[21] Appl. No.: 138,179

[22] Filed: Apr. 7, 1980

[51] Int. Cl.$^3$ .......................... G05F 1/00; H01F 40/06
[52] U.S. Cl. .................................... 323/218; 323/358
[58] Field of Search ............... 323/108, 109, 110, 120, 323/121, 122, 124, 127, 128, 208, 212, 215, 218, 315–316, 356–358

[56] References Cited

U.S. PATENT DOCUMENTS 3,142,015  7/1964  Kusters et al. .................. 323/110 X
3,188,562  6/1965  Kusters et al. .................. 336/211 X
3,568,045  3/1971  Yorke ................................ 323/108

Primary Examiner—William M. Shoop
Assistant Examiner—Peter S. Wong
Attorney, Agent, or Firm—Edward Rymek

[57] ABSTRACT

This reference source provides a current which is of relatively high magnitude and which leads the voltage by substantially 90°. It includes a reference capacitor which is highly stable and pure but of low capacitance, and a power capacitor which has a high capacitance. The capacitors are connected together at one end for coupling to a voltage source. A current comparator compares the currents flowing through the reference capacitor and the power capacitor, and provides a difference signal. A circuit generates a current in response to the difference signal and adds the generated current to the current through the power capacitor resulting in a current having a waveform and phase substantially identical to the reference capacitor current which leads the voltage source voltage by substantially 90°.

4 Claims, 1 Drawing Figure

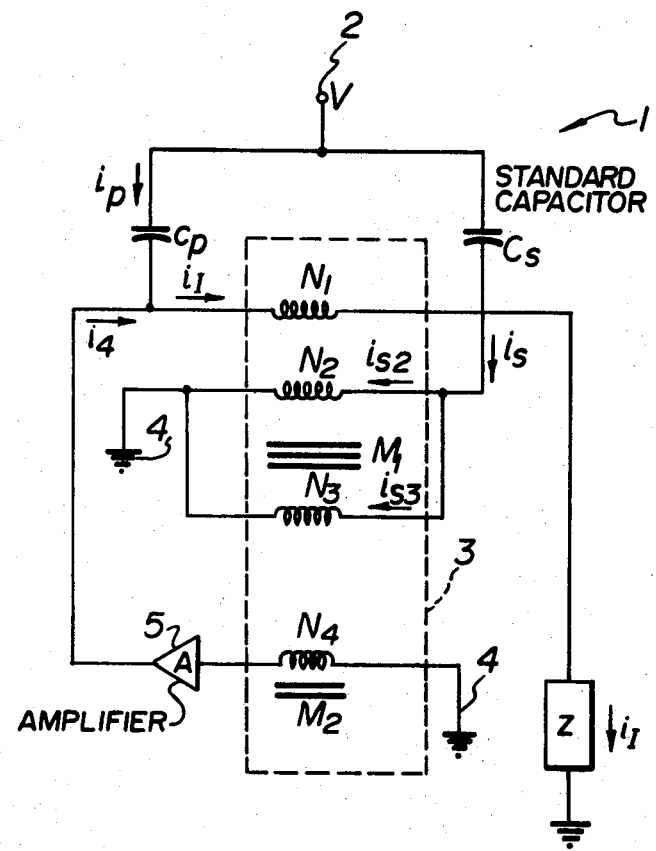

4,296,369

ACTIVE QUADRATURE CURRENT REFERENCE SOURCE

BACKGROUND OF THE INVENTION

This invention is directed to apparatus for providing an output current which is leading the voltage, and in particular to apparatus in which the output current is leading by substantially 90°.

To calibrate reactive volt-ampere and volt-ampere-hour meters, and for use in precision bridges, it is necessary to have a reference source that can provide a current which leads the voltage by substantially 90°. This can be accomplished by using gas-dielectric capacitors in a circuit as these are known for their high stability and purity. However, physical constraints limit their capacitance value to 0.001 microfarads or less which does not allow for sufficiently high current levels.

SUMMARY OF THE INVENTION

It is therefore an object of this invention to provide a stable apparatus in which the output current leads the voltage at current levels sufficient for use as a reference source.

This and other objects are achieved in an apparatus which includes a reference capacitor $C_s$ which is highly stable and pure but of low capacitance and a power capacitor $C_p$ which has a high capacitance. The capacitors are connected together at one end for coupling to a voltage source. A current comparator compares the current flowing through the reference capacitor to the current flowing through the power capacitor, and provides a difference signal. A circuit generates a current in response to the difference signal and adds the generated current to the power capacitor current resulting in a current having a waveform and phase substantially identical to the reference capacitor current which leads the voltage source voltage by substantially 90°.

In accordance with another aspect of the invention, the current comparator includes an inner core and an outer core. The outer core has a winding $N_1$ coupled to the power capacitor $C_p$ and a winding $N_2$ coupled to the reference capacitor $C_s$. The inner core has a detector winding $N_4$ for producing the difference signal. The circuit which generates the current in response to the difference signal includes an amplifier which is connected between the detector winding $N_4$ and the winding $N_1$. The amplifier amplifies the detector winding current and applies it to the winding $N_1$ such that the ampere turns through $N_1$ balance with the ampere turns through $N_2$.

In accordance with another aspect of this invention, the current comparator includes a further winding $N_3$ which is wound on the inner core, and which is connected across the winding $N_2$. Windings $N_2$ and $N_3$ may have the same number of turns.

Many other objects and aspects of the invention will be clear from the detailed description of the drawings.

BRIEF DESCRIPTION OF THE DRAWINGS

In the drawings:

FIG. 1 is a schematic of the reference source in accordance with this invention.

DETAILED DESCRIPTION OF THE EMBODIMENTS

The active reference source in accordance with the present invention is illustrated in FIG. 1. The reference source 1 includes a standard capacitor $C_s$ which has a stable and constant capacitance. For example, an air dielectric Invar metal capacitor having a capacitance of 1000 pf or less and a stability of 10 p.p.m. would be preferred as capacitor $C_s$. The reference source further includes a power capacitor $C_p$ which has a much higher capacitance and therefore is much less stable and has a higher resistance component. For example, $C_p$ may be a solid dielectric capacitor having a capacitance in the order of 0.265 μf with an impedance of 10 kΩ @60 hz.

The first terminal of each of the capacitors $C_s$ and $C_p$ are connected to a voltage terminal 2 to which a voltage is to be applied.

The active reference source 1 further includes a current comparator 3 which may be of the type described in U.S. Pat. No. 3,188,562 which issued to N. L. Kusters et al on June 8, 1965 and which is incorporated herein by reference. The comparator 3 included an outer winding $N_1$ and an outer winding $N_2$ which are wound on an outer core $M_1$ as well as an inner winding $N_3$ and detector winding $N_4$ wound on an inner core $M_2$. The outer winding $N_2$ and the inner winding $N_3$ are connected in parallel between the second terminal of capacitor $C_s$ and ground 4. The outer winding $N_1$ is connected between the second terminal of capacitor $C_p$ and a load Z. Detector winding $N_4$ is connected through an amplifier 5 to the second terminal of capacitor $C_p$.

In operation, a voltage V, which may be from a 120 V supply, is applied to terminal 2 resulting in a current $i_s$ through the standard capacitor $C_s$ and a current $i_p$ through the second capacitor $C_p$. Since $C_s$ is small, the current $i_s$ will be very small and therefore unusable as a standard. The current through $C_p$ will be large but unstable and may have a phase angle defect. The current $i_s$ flows as current $i_{s2}$ and $i_{s3}$ to ground 4 through windings $N_2$ and $N_3$ respectively, which each preferably have the same number of turns. Since core $M_2$ is an inner core and core $M_1$ is an outer core, the current $i_{s2}$ imposes an ampere-turn magnetizing force on both $M_1$ and $M_2$. The current $i_{s3}$ which passes through $N_3$ imposes an ampere-turn magnetizing force on the core $M_2$ only. The division of the current $i_s$ into currents $i_{s2}$ and $i_{s3}$ is determined more or less by the current $i_1$ in winding $N_1$, since near ampere-turn balance must be maintained by the currents in windings $N_1$ and $N_2$ acting in magnetic core $M_1$. The current $i_{s3}$ is very small and this combined with a very low impedance in the $N_3$ winding and, as will be seen, a zero flux condition in magnetic core $M_2$ results in a negligible voltage drop in the $N_3$ winding circuit. Sufficient ampere-turn unbalance between the currents in windings $N_1$ and $N_2$ is then required to magnetize magnetic core $M_1$ so as to generate a voltage in winding $N_2$ equal and opposite to its impedance voltage with current $i_{s2}$.

Detector winding $N_4$ determines the difference between the ampere-turns $i_1 N_1$ with $i_1$ derived from $i_p$ and the effective ampere-turns $i_s N_2$, where $i_s = i_{s2} + i_{s3}$ and $N_2 = N_3$. Amplifier 5 generates a current $i_4$ such that $i_1 N_1 = i_s N_2$ where $i_1 = i_p + i_4$. In this way, $i_1$ is a replica of current $i_s$ with a larger amplitude, i.e.

$$i_1 = (N_2/N_1) V j w C_s$$

As mentioned above, the voltage supply may be the normal 60 cycle 120 V commercial outlet. Capacitors $C_s$ and $C_p$ may be in the order of 1000 pf and 0.265 μf respectively, and thus $i_1 \approx 12$ ma and $i_s \approx 0.045$ ma.

Windings $N_2$ and $N_3$ would preferably have an identical number of turns. The turns ratio $N_1/N_2$ is related such that $C_s/C_p \approx N_1/N_2$. In this example, $N_1 = 1$ and $N_2 = 265$.

The current $i_1$ flowing to the load Z is thus equal to $(N_2/N_1)VjwC_2$. It is substantially 90° out of phase and leads the voltage. Thus $i_1$ takes on the characteristics of $i_s$, being constant and stable, and has an amplitude sufficiently high to be of value for calibrating meters.

Modifications in the above described embodiments of the invention can be carried out without departing from the scope thereof and therefore the scope of the present invention is intended to be limited only by the appended claims.

We claim:

1. A reference source comprising:
   a reference capacitor $C_s$ of high stability and purity and low capacitance for coupling to a voltage source;
   a power capacitor $C_p$ of high capacitance for coupling to the voltage source;
   current comparator means coupled to the reference capacitor and the power capacitor for comparing currents through the capacitors $C_s$ and $C_p$ and for providing a difference signal; and
   circuit means coupled to the current comparator means for generating a current in response to the difference signal and for adding the generated current to the current through the power capacitor to produce a combined output current having a waveform and phase identical to the current through the reference capacitor $C_s$.

2. A reference source as claimed in claim 1 wherein the current comparator includes an inner core and an outer core; the outer core having a winding $N_1$ coupled to the power capacitor $C_p$ and a winding $N_2$ coupled to the reference capacitor $C_s$; the inner core having a detector winding $N_4$ for producing the difference signal.

3. A reference source as claimed in claim 2 wherein the circuit means includes amplifier means connected between the detector winding and the winding $N_1$ for amplifying the detector winding current and applying the amplified current to the winding $N_1$.

4. A reference source as claimed in claim 3 wherein the current comparator includes a further winding $N_3$ wound on the inner core, the further winding being connected across the winding $N_2$ and having the same number of turns as the winding $N_2$.

* * * * *